United States Patent
Liu

(10) Patent No.: US 8,476,738 B2
(45) Date of Patent: Jul. 2, 2013

(54) ELECTRONIC PACKAGE WITH STACKED SEMICONDUCTOR CHIPS

(76) Inventor: Chien-Hung Liu, Taipei (TW)

(*) Notice: Subject to any disclaimer, the term of this patent is extended or adjusted under 35 U.S.C. 154(b) by 213 days.

(21) Appl. No.: 12/826,251

(22) Filed: Jun. 29, 2010

(65) Prior Publication Data

US 2011/0317371 A1 Dec. 29, 2011

(51) Int. Cl.
*H01L 29/06* (2006.01)
(52) U.S. Cl.
USPC .............. 257/622; 257/686; 257/43; 438/116
(58) Field of Classification Search
USPC .................................... 257/686, 622
See application file for complete search history.

(56) References Cited

U.S. PATENT DOCUMENTS

| 2005/0121765 A1* | 6/2005 | Lin ............................ 257/686 |
| 2008/0083976 A1* | 4/2008 | Haba et al. .................. 257/686 |
| 2008/0169546 A1* | 7/2008 | Kwon et al. ................. 257/686 |

* cited by examiner

*Primary Examiner* — Ajay K Arora
(74) *Attorney, Agent, or Firm* — Birch, Stewart, Kolasch & Birch, LLP

(57) ABSTRACT

An electronic component package is described. The electronic component package includes a first electronic component package module mounted on a surface of a packaging layer. A second electronic component package module laminated on a bottom of the first electronic component package module is mounted on a surface of a packaging layer. The first and second electronic component package modules respectively include at least two semiconductor chips laminated. A first redistribution layer is between the first and the second electronic component package modules, electrically connected to the first and the second electronic component package modules. A conductive bump is mounted on a bottom of the second electronic component package module, electrically connected to the second electronic component package module.

22 Claims, 10 Drawing Sheets

ELECTRONIC PACKAGE WITH STACKED SEMICONDUCTOR CHIPS

BACKGROUND OF THE INVENTION

1. Field of the Invention

The present invention relates to an electronic component package and fabrication method thereof, and in particular relates to a stacked electronic component package and fabrication method thereof.

2. Description of the Related Art

Due to demand for miniaturized, lightweight and powerful electronic products, stacked electronic component packages have been disclosed. For a conventional chip scale package (CSP) using wire bonding technology, semiconductor chips are electrically connected to the lead outside of the package using bonding wires. Thus, for a stacked chip scale package (SCSP), the size of an upper level semiconductor chip is required to be larger or smaller than that of a lower level semiconductor chip. Therefore, miniaturization is hindered. While the total thickness of an SCSP may be reduced by a chip grinding process, the required chip grinding process increases chip packaging complexity and wire bonding difficulties along with broken chips, thus increasing costs. Additionally, since the size of the upper level semiconductor chip is larger than that of the lower level semiconductor chip, an overhang problem occurs, causing the upper level semiconductor chip to vibrate during the wire bonding process. Therefore, feasibly increasing the number of layers of an SCSP by conventional methods is not available, making stacked electronic component packages unable to meet further demands for even more miniaturized, lightweight and powerful electronic products.

Thus, a novel stacked electronic component package and fabricating method thereof having large numbers of stacked chips, high fabrication yield and low fabrication costs are desired.

BRIEF SUMMARY OF THE INVENTION

In accordance with an embodiment of the invention, an electronic component package is provided. The electronic component package comprises: a packaging layer; a first electronic component package module with a top surface mounted on a surface of the packaging layer; a second electronic component package module laminated on a bottom of the first electronic component package module, wherein the first and second electronic component package modules respectively comprise at least two semiconductor chips laminated; and a conductive trace layer conformably mounted on sides and backsides of the first and the second electronic component package modules, respectively electrically connected to the first and the second electronic component package modules; a first redistribution layer between the first and the second electronic component package modules, respectively electrically connected to the conductive trace layer of the first and the second electronic component package modules; a conductive bump mounted on a bottom of the second electronic component package module, electrically connected to the second electronic component package module.

In accordance with another embodiment of the invention, a method for fabricating an electronic component package is provided. The method for fabricating an electronic component package comprises: providing a packaging layer; forming a first level electronic component package module on a surface of the packaging layer, wherein the first level electronic component package module is fabricated by laminating at least two semiconductor wafers together, and the semiconductor wafers respectively comprise at least two semiconductor chips separated from each other by a trench; forming a first redistribution layer on a bottom surface of the first level electronic component package module, wherein the first redistribution layer is electrically connected to the first level electronic component package module; forming a second electronic component package module on the bottom surface of the first electronic component package module, wherein the second level electronic component package module is fabricated by laminating at least two semiconductor wafers together, and the semiconductor wafers respectively comprise at least two semiconductor chips isolated from each other by a trench; and forming a conductive bump on a bottom surface of the second electronic component package module, electrically connected to the second electronic component package module and the first redistribution layer.

A detailed description is given in the following embodiments with reference to the accompanying drawings.

BRIEF DESCRIPTION OF THE DRAWINGS

The present invention may be more fully understood by reading the subsequent detailed description and examples with references made to the accompanying drawings, wherein:

FIGS. 1-7a and 7b are cross-sectional views showing the steps for forming an electronic component package in accordance with an embodiment of the present invention.

DETAILED DESCRIPTION OF THE INVENTION

Figure 1:
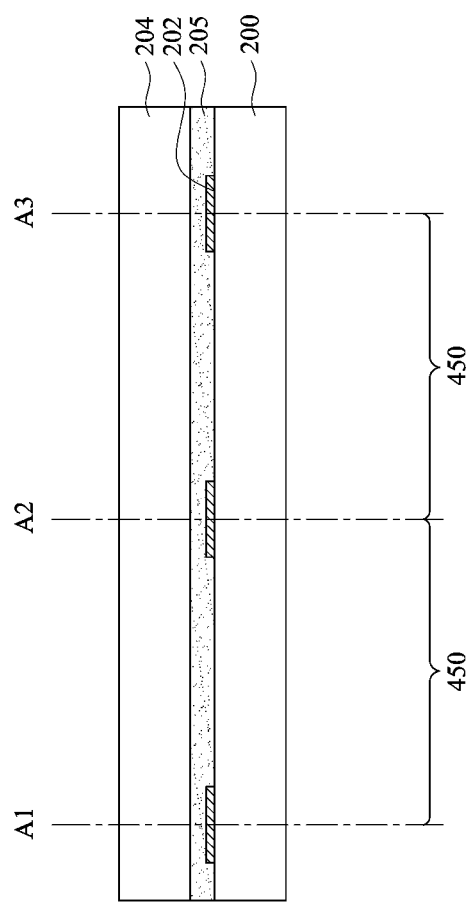

The following description is of a mode for carrying out the invention. This description is made for the purpose of illustrating the general principles of the invention and should not be taken in a limiting sense. The scope of the invention is best determined by reference to the appended claims. Wherever possible, the same reference numbers are used in the drawings and the descriptions to refer the same or like parts.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated and not drawn to scale for illustrative purposes. The dimensions and the relative dimensions do not correspond to actual dimensions to practice of the invention.

FIGS. 1-7a and 7b are cross-sectional views showing the steps for forming an electronic component package 500a in accordance with an embodiment of the present invention. FIGS. 8a and 8b are cross-sectional views showing the steps for forming an electronic component package 500b in accordance with another embodiment of the present invention. The electronic component packages of the embodiments of the invention may be applied to active or passive devices, or electronic components with digital or analog circuits, such as opto electronic devices, micro electro mechanical systems (MEMS), micro fluidic systems, and physical sensors for detecting heat, light, or pressure. Particularly, a wafer level package (WLP) process may be applied to package semiconductor chips, such as image sensor devices, light-emitting diodes (LEDs), solar cells, RF circuits, accelerators, gyroscopes, micro actuators, surface acoustic wave devices, pressure sensors, or ink printer heads. The wafer level packaging process herein mainly means that after the packaging process is accomplished during the wafer stage, the wafer with chips is cut to obtain separate independent packages. However, in an embodiment of the invention, separate independent chips may be redistributed overlying a supporting wafer and then be packaged, which may also be referred to as a wafer level packaging process. In addition, the wafer level packaging process may also be adapted to form electronic device packages of multi-layered integrated circuit devices by stacking a plurality of wafers having integrated circuits together.

Referring to FIG. 1, a first semiconductor wafer 200 having a plurality of electronic component areas 450 separated by scribe lines $A_1$, $A_2$ and $A_3$ is first provided. Each electronic component area 450 may comprise a semiconductor chip, wherein each semiconductor chip comprises an electronic component (not shown) and a plurality of conductive pads 202 mounted over the electronic component. The conductive pads 202 are electrically connected to the electronic component through metal interconnections (not shown). In one embodiment, the first semiconductor wafer 200 may comprise semiconductor materials, transparent semiconductor materials or dielectric materials. In one embodiment, the number of the electronic component and the conductive pads is not limited but according to the chip design.

Next, a bonding layer 205 is formed on the first semiconductor wafer 200, covering the conductive pads 202. Next, the first semiconductor wafer 200 is attached to a surface of a packaging layer 204 through the bonding layer 205. In one embodiment, the bonding layer 205 may include a polymer film, or one or more of an adhesive such as epoxy, polyurethane, silicone or benzocyclobutene (BCB). The attachment of the first semiconductor wafer 200 and the bonding layer 205 may be optionally hermetically sealed by use of bonding techniques like polymer bonding or intermetallic bonding such as solder and anodic bonding, or any other suitable method, such as thermal compression bonding, glass frit bonding or eutectic bonding. In one embodiment, the packaging layer 204 is used to carrier the first semiconductor wafer 200 and the subsequent laminated wafers. The packaging layer 204 may comprise silicon, metal, glass, quartz, plastic or opal.

Figure 2:
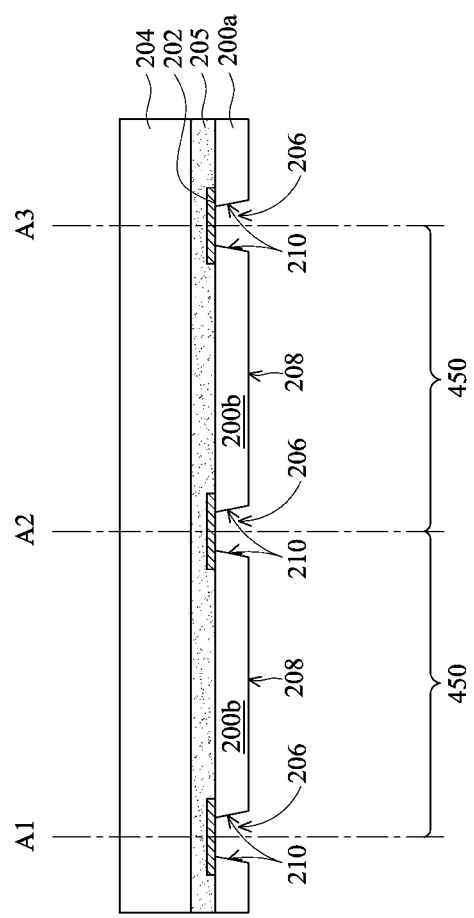

Next, referring to FIG. 2, a thinning down process is performed to thin down a backside of the first semiconductor wafer 200 to form a first semiconductor wafer 200a with a preferred thickness by etching, milling or grinding and polishing the surface of the first semiconductor wafer 200. Next, a portion of the first semiconductor wafer 200a is removed from a backside 208 of the first semiconductor wafer 200a until the conductive pads 202 are exposed. Therefore, a plurality of first trenches 206 is formed in positions where the scribe lines $A_1$, $A_2$ and $A_3$ are located. As shown in FIG. 2, the first trenches 206 are extended from the backside 208 of the first semiconductor wafer 200a into the first semiconductor wafer 200a.

Figure 3:
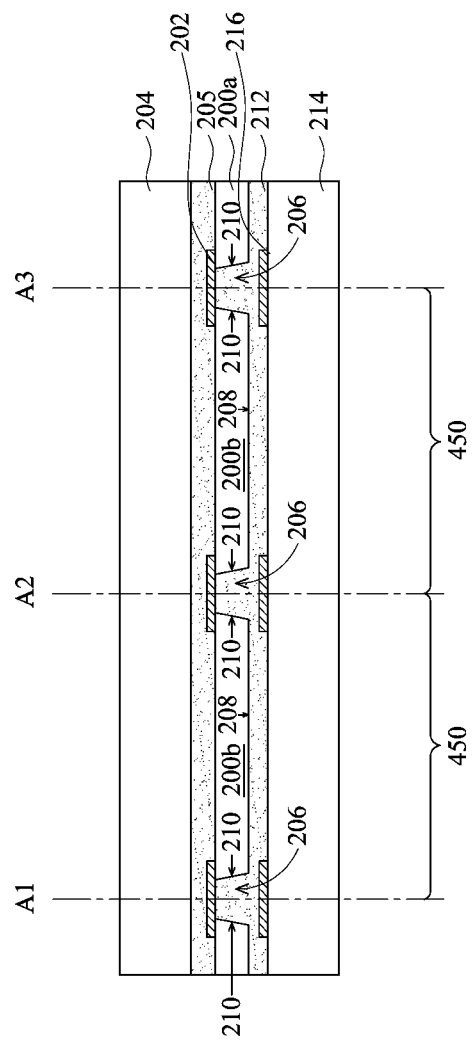

Next, referring to FIG. 3, a first insulating layer 212 covers the backside 208 of the first semiconductor wafer 200a, filling the first trenches 206. The first semiconductor wafer 200a and the second semiconductor wafer 214 are bonded together through the first insulating layer 212, thereby laminating the first semiconductor wafer 200a and the second semiconductor wafer 214. Similarly, the second semiconductor wafer 214 has a plurality of semiconductor chips separated by the same scribe lines $A_1$, $A_2$ and $A_3$. That is, the semiconductor chips of the second semiconductor wafer 214 may located in the corresponding area substantially with that of the first semiconductor wafer 200a. And the scribe lines used to separate semiconductor chips of the second semiconductor wafer 214 are aligned to the scribe lines used to separate semiconductor chips of the first semiconductor wafer 200a. Similarly, each semiconductor chip of the second semiconductor wafer 214 may comprise an electronic component (not shown) and a plurality of conductive pads 216 mounted over the electronic component. The conductive pads 216 are electrically connected to the electronic component through metal interconnections (not shown). In one embodiment, the first semiconductor wafer 200a and the second semiconductor wafer 214 may comprise semiconductor chips having the same function.

In one embodiment, the first insulating layer 212 may comprise epoxy, silicon oxide, solder mask, or any other suitable dielectric material, such as silicon nitride, silicon oxinitride, metal oxide, polyimide, benzocyclobutene (BCB™), parylene, polynaphthalenes, fluorocarbons or accrylates. The first insulating layer 212 may be formed by spin coating, or may be formed by any suitable method, such as spray coating, curtain coating, liquid phase deposition, physical vapor deposition, chemical vapor deposition, low pressure chemical vapor deposition, plasma enhanced chemical vapor deposition, rapid thermal chemical vapor deposition or atmospheric pressure chemical vapor deposition.

Figure 4:
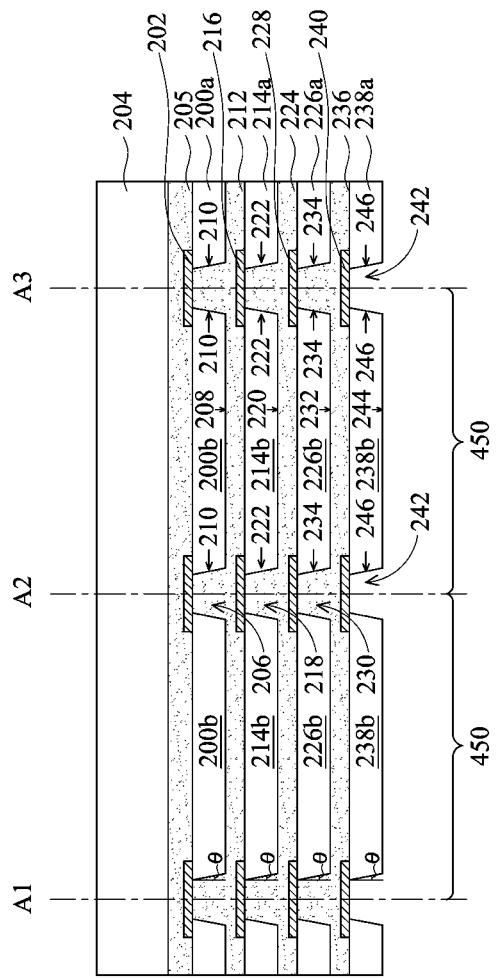

Next, referring to FIG. 4, a thinning down process is performed to thin down a backside of the second semiconductor wafer 214 to form a second semiconductor wafer 214a. A portion of the second semiconductor wafer 214a is then removed until the conductive pads are exposed using selective removal processes such as photolithography and etching processes. Therefore, a plurality of second trenches 218 is formed in positions where the scribe lines $A_1$, $A_2$ and $A_3$ are located. In one embodiment, the thinning down processes for the first semiconductor wafer 200 and second semiconductor wafer 214 may be the same. Similarly, the processes used to form the first trenches 206 and the second trenches 218 may be the same.

Next, referring to FIG. 4 again, the processes for forming the insulating layer, bonding the semiconductor wafers, thinning down the semiconductor wafers and forming the trenches as shown in FIGS. 2 and 3 are repeated to form a third semiconductor wafer 226a, a fourth semiconductor wafer 238a, a second insulating layer 224 and the third insulating layer 236. The third semiconductor wafer 226a comprises a plurality of semiconductor chips 226b separated by third trenches 230 and the fourth semiconductor wafer 238a comprises a plurality of semiconductor chips 238b separated by fourth trenches 242. The second insulating layer 224 is used to separate the second semiconductor wafer 214a and the third semiconductor wafer 226a, and the third insulating layer 236 is used to separate the third semiconductor wafer 226a and the fourth semiconductor wafer 238a. As shown in FIG. 4, in one embodiment, the first trench 206, the second trench 218, the third trench 230 and the fourth trench 242 are aligned with each other. Angles between the sides and the normal lines of the semiconductor chips of the first semiconductor wafer 200a, the second semiconductor wafer 214a, the third semiconductor wafer 226a and the fourth semiconductor wafer 238a are substantially the same and labeled as θ. The angles θ may be larger than 0° and smaller than 90°. Therefore, a side 210 of the semiconductor chips 200b of the first semiconductor wafer 200a, a side 222 of the semiconductor chips 214b of the second semiconductor wafer 214a, a side 234 of the semiconductor chips 226b of the third semiconductor wafer 226a, a side 246 of the semiconductor chips 238b of the fourth semiconductor wafer 238a are not coplanar, and angles between the sides 210, 222, 234 and 246 and the normal lines of the semiconductor chips of each semiconductor wafer are substantially the same and labeled as θ.

Figure 5:
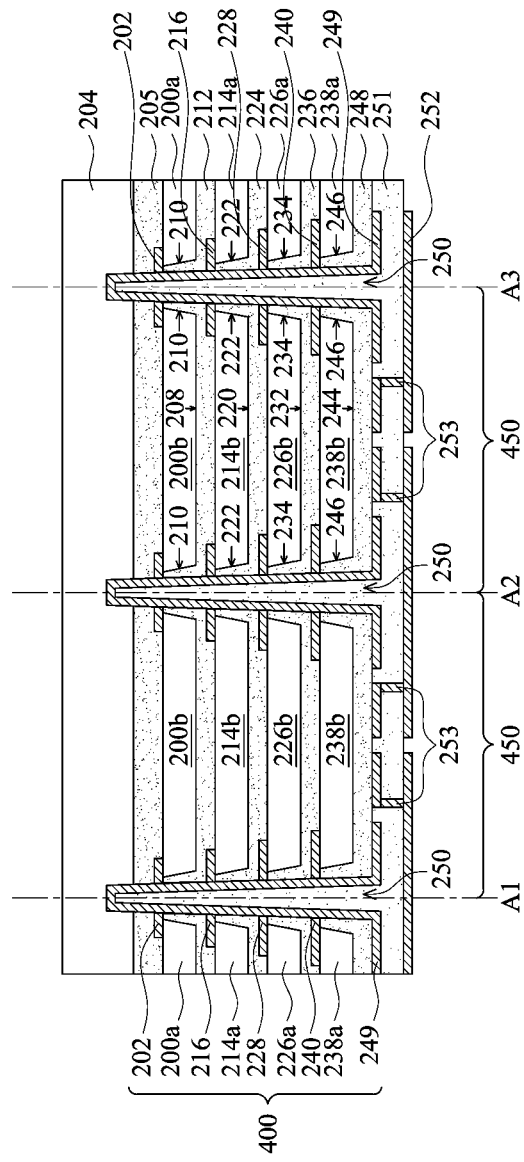

Referring to FIG. 5, next, a fourth insulating layer 248 covers a backside 244 of the fourth semiconductor wafer 238a, filling the fourth trenches 242. In one embodiment, the first insulating layer 212, the second insulating layer 224, the third insulating layer 236 and the fourth insulating layer 248 may comprise the same materials and be formed by the same formation method. Next, a portion of the fourth insulating layer 248 in the fourth trench 242, a portion of conductive pads 240, a portion of the third insulating layer 236 in the third trench 230, a portion of conductive pads 228, a portion of the second insulating layer 224 in the second trench 218, a portion of conductive pads 216, a portion of the first insulating layer 206 in the first trench 212, a portion of conductive pads 202, a portion of the bonding layer 205 and a portion of packaging layer 204 are removed from the backside 244 of the fourth semiconductor wafer 238a to form a first notch 250 using selective removal processes such as photolithography and etching processes. Next, a first conductive trace layer 249 is conformably formed on a portion of the fourth insulating layer 248 on the backside of the fourth semiconductor wafer 238a and sides of the first notch 250, electrically connected to the sides of the conductive pads 202, 216, 228 and 240. The first conductive trace layer 249 is used to transmit input/output (I/O) signals, ground signals, and power signals of the semiconductor chips of the first semiconductor wafer 200a, the second semiconductor wafer 214a, the third semiconductor wafer 226a and the fourth semiconductor wafer 238a. For example, the first conductive trace layer 249 may comprise metal layers or metal alloy layers such as a Ni layer, a Ag layer, a Al layer, a Cu layer or alloy layers thereof. Also, the first conductive trace layer 249 may comprise doped polysilicon, single crystalline silicon, conductive glasses and so on. Additionally, the first conductive trace layer 249 comprising metal layers may be combined with annealing metals such as Ti, Mo, Cr, TiW and so on. In a specific embodiment, an Ni/Au layer may be partially or entirely formed on a surface of the metal layer. Therefore, a first electronic component package module 400 is formed comprising the first semiconductor wafer 200a, the second semiconductor wafer 214a, the third semiconductor wafer 226a, the fourth semiconductor wafer 238a, the conductive pads 202, 216, 228 and 240 and the first conductive trace layer 249. One embodiment of the first electronic component package module 400 is formed by laminating at least two semiconductor wafers. And the semiconductor wafers comprise at least two semiconductor chips separated by a trench, respectively.

Next, referring to FIG. 5 again, a fifth insulating layer 251 is entirely formed on a bottom surface of the first electronic component package module 400, filling the first notch 250. In one embodiment, the first insulating layer 212, the second insulating layer 224, the third insulating layer 236 and the fourth insulating layer 248 may comprise the same materials and be formed by the same formation method. A first redistribution layer 252 is then formed on a bottom of the fifth insulating layer 251, electrically connected to the first conductive trace layers 249 through metal interconnections 253 determined by circuit design. In one embodiment, the first redistribution layer 252 may redistribute positions of the first conductive trace layers 249, for example, the first redistribution layer 252 may be formed to extend the first conductive trace layers 249 from the periphery of the semiconductor chip to the entire surface of the semiconductor chip, to transmit signals of each semiconductor chip of the first electronic component package module 400 to the exterior. The first redistribution layer 252 may be formed extended from the periphery of the semiconductor chip to the center of the semiconductor chip.

Figure 6:
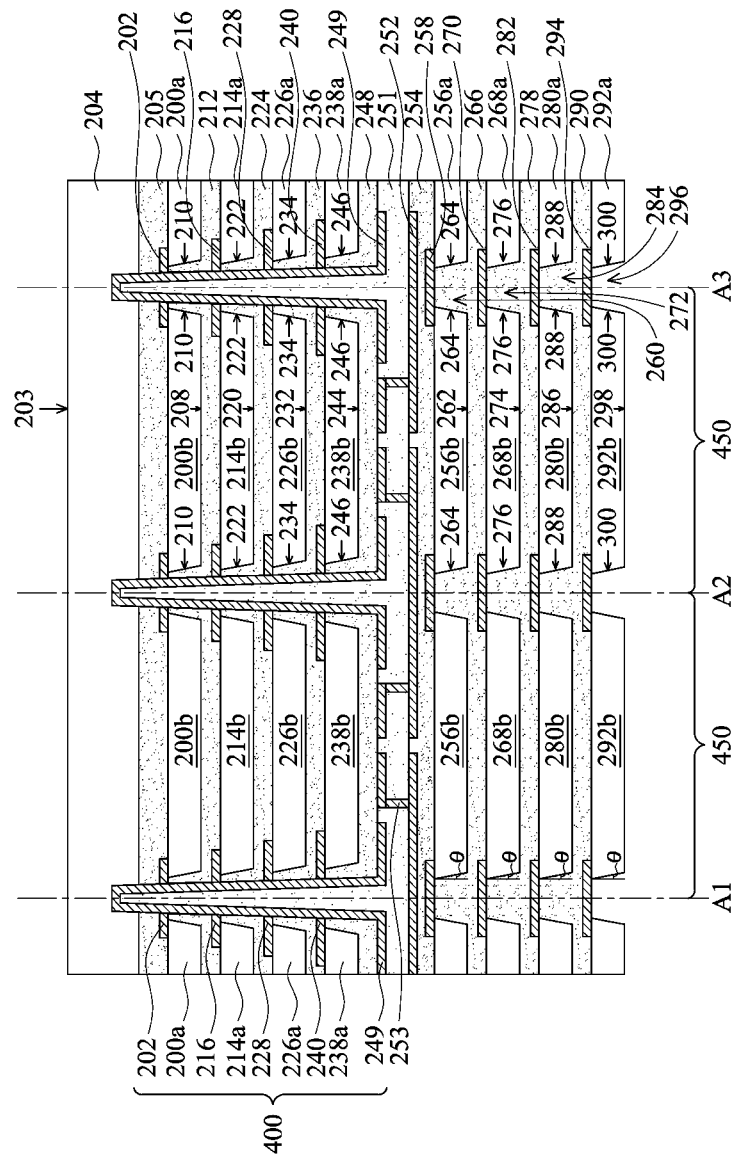

Next, referring to FIG. 6, a sixth insulating layer 254 is formed on a bottom surface of the first redistribution layer 252. Next, the first electronic component package module 400 and a fifth semiconductor wafer 256a are bonded together through the sixth insulating layer 254. Similarly, the fifth semiconductor wafer 256a has a plurality of semiconductor chips 256b separated by the same scribe lines $A_1$, $A_2$ and $A_3$. That is, the semiconductor chips of the fifth semiconductor wafer 256a may be located in the corresponding area substantially with that of the first electronic component package module 400. Similarly, each semiconductor chip of the fifth semiconductor wafer 256a may comprise an electronic component (not shown) and a plurality of conductive pads 258 mounted over the electronic component. The conductive pads 216 are electrically connected to the electronic component through metal interconnections (not shown). In one embodiment, the first electronic component package module 400 and the fifth semiconductor wafer 256a may comprise semiconductor chips having the same function.

Next, referring to FIG. 6 again, the processes for forming the insulating layer, bonding the semiconductor wafers, thinning down the semiconductor wafers and forming the trenches as shown in FIGS. 2 to 4 are repeated to form a sixth semiconductor wafer 268a, a seventh semiconductor wafer 280a, a eighth semiconductor wafer 292a, a seventh insulating layer 266, a eighth insulating layer 278 and the ninth insulating layer 290. The sixth semiconductor wafer 268a comprises a plurality of semiconductor chips 268b separated by sixth trenches 272, the seventh semiconductor wafer 280a comprises a plurality of semiconductor chips 280b separated by seventh trenches 284, and the eighth semiconductor wafer 292a comprises a plurality of semiconductor chips 292b separated by eighth trenches 296. The eighth insulating layer 278 is used to separate the sixth semiconductor wafer 268a and the seventh semiconductor wafer 280a, and the ninth insulating layer 290 is used to separate the seventh semiconductor wafer 280a and the eighth semiconductor wafer 292a. In one embodiment, the fifth trench 260, the sixth trenches 272, the seventh trenches 284 and the eighth trenches 296 are aligned with each other and in positions where the scribe lines $A_1$, $A_2$ and $A_3$ located. Therefore, the first trench 206, the second trench 218, the third trench 230, the fourth trench 242, the fifth trench 260, the sixth trenches 272, the seventh trenches 284 and the eighth trenches 296 are aligned with each other. Similarly, angles between the sides and the normal lines of the semiconductor chips of the fifth semiconductor wafer 256a, the sixth semiconductor wafer 268a, the seventh semiconductor wafer 280a and the eighth semiconductor wafer 292a are substantially the same and labeled as θ. The angles θ may be larger than 0° and smaller than 90°. Therefore, a side 264 of the semiconductor chips 256b of the fifth semiconductor wafer 256a, a side 276 of the semiconductor chips 268b of the sixth semiconductor wafer 268a, a side 288 of the semiconductor chips 280b of the seventh semiconductor wafer 280a, a side 300 of the semiconductor chips 292b of the eighth semiconductor wafer 292a are not coplanar, and angles between the sides 264, 276, 288 and 300 and the normal lines of the semiconductor chips of each semiconductor wafer are substantially the same and labeled as θ.

Figure 7A:
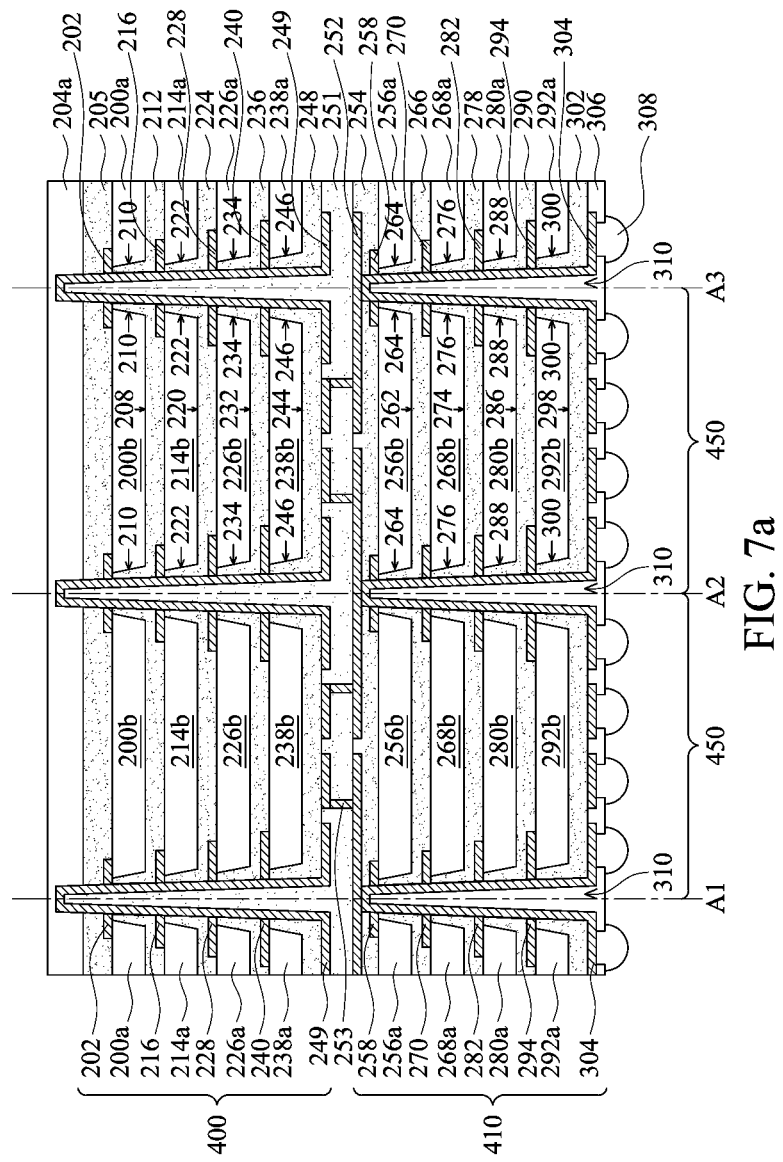
Figure 8A:
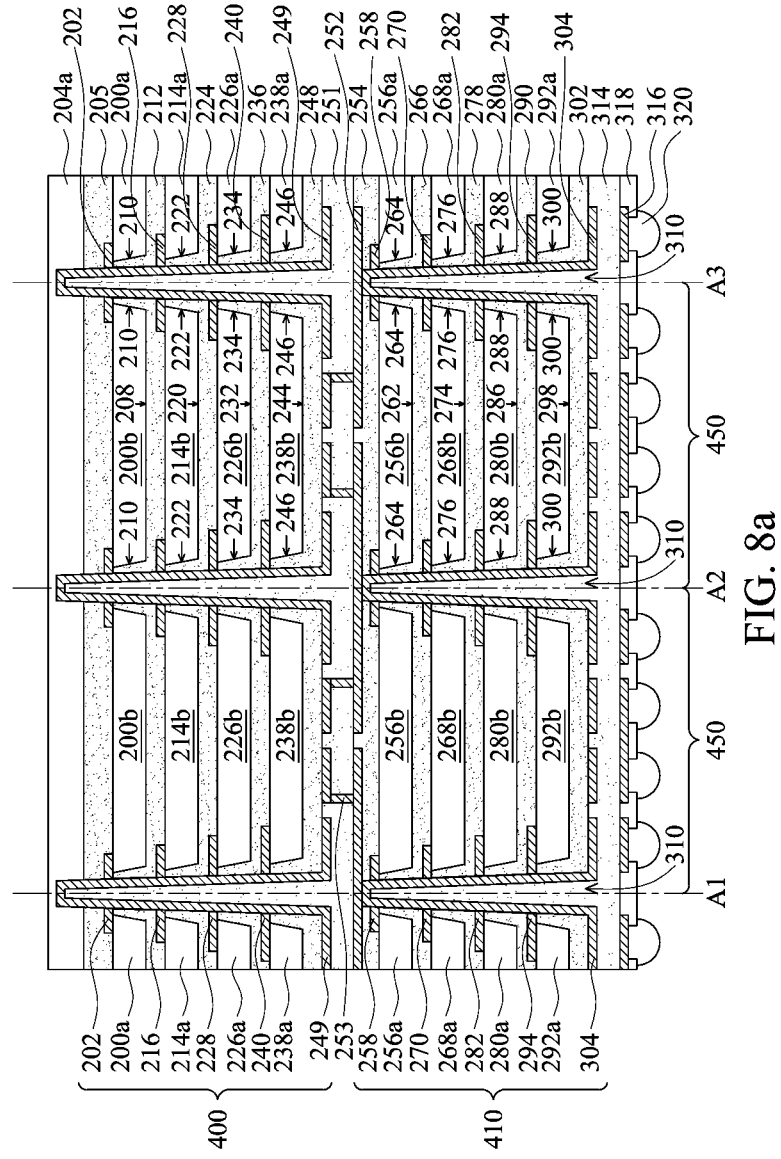
FIGS. 8a and 8b are cross-sectional views showing the steps for forming an electronic component package in accordance with another embodiment of the present invention.
Figure 8B:
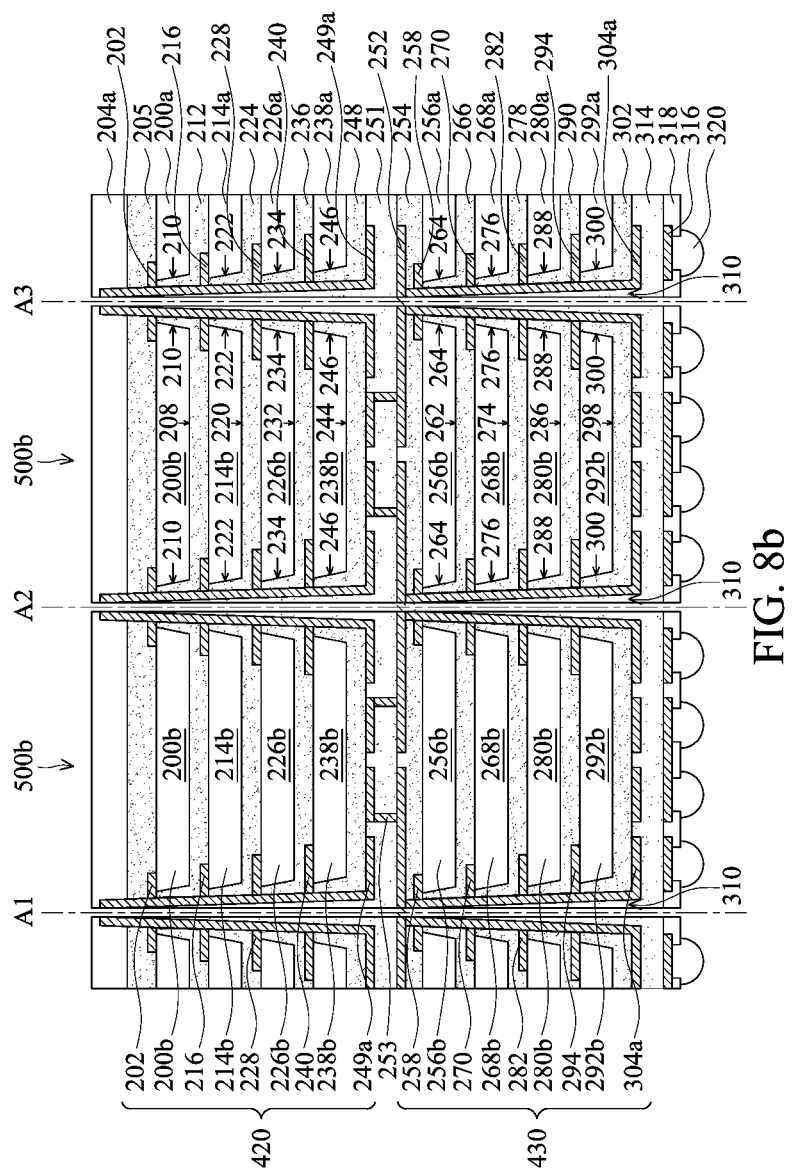

Next, referring to FIG. 7a, a tenth insulating layer 302 covers a backside 298 of the eighth semiconductor wafer 292a, filling the eighth trenches 296 as shown in FIG. 6. In one embodiment, the seventh insulating layer 266, the eighth insulating layer 278, the ninth insulating layer 290 and the tenth insulating layer 302 may comprise the same materials and be formed by the same formation method. Next, a portion of the tenth insulating layer 302 in the eighth trenches 296, a portion of conductive pads 294, a portion of the ninth insulating layer 290 in the seventh trenches 284, a portion of conductive pads 282, a portion of the eighth insulating layer 278 in the sixth trench 276, a portion of conductive pads 270, a portion of the seventh insulating layer 266 in the fifth trench 260, a portion of conductive pads 258, a portion of the sixth insulating layer 254 are removed from the backside 298 of the eighth semiconductor wafer 292a until the first redistribution layer 252 is exposed to form a second notch 310 using selective removal processes such as photolithography and etching processes. Next, a second conductive trace layer 304 is conformably formed on a portion of the tenth insulating layer 302 on the backside of the eighth semiconductor wafer 292a and sides of the second notch 310, electrically connected to the sides of the conductive pads 258, 270, 282 and 294. The second conductive trace layer 304 is used to transmit input/output (I/O) signals, ground signals, and power signals of the semiconductor chips of the first semiconductor wafer 200a, the second semiconductor wafer 214a, the third semiconductor wafer 226a, the fourth semiconductor wafer 238a, the fifth semiconductor wafer 256a, the sixth semiconductor wafer 268a, the seventh semiconductor wafer 280a and the eighth semiconductor wafer 292a. For example, the first conductive trace layer 249 and the second conductive trace layer 304 may comprise the same materials. Therefore, a second electronic component package module 410 is formed comprising the fifth semiconductor wafer 256a, the sixth semiconductor wafer 268a, the seventh semiconductor wafer 280a, the eighth semiconductor wafer 292a, the conductive pads 258, 270, 282 and 294 and the second conductive trace layer 304. One embodiment of the second electronic component package module 410 is formed by laminating at least two semiconductor wafers. And the semiconductor wafers comprise at least two semiconductor chips separated by a trench, respectively.

Next, a thinning down process is performed to thin down a top surface 203 of the packaging layer 204 to form a packaging layer 204a with a preferred thickness by etching, milling or grinding and polishing the top surface 203 of the packaging layer 204.

Next, a passivation layer 306 is conformably formed on a backside of the second electronic component package module 410, covering sides of the second notch 310 and the second conductive trace layer 304. In one embodiment, the passivation layer 306 may be formed by coating solder mask materials. A patterning process is then performed to the passivation layer 306 to form terminal contact openings (not shown) on a surface of the second conductive trace layer 304. Then, solder joints may be formed filling the terminal contact openings of the passivation layer 306 by either plating through a patterned photo-resist or screen printing through a stencil mask. A final stripping of seed layers and (or) photo-resist followed by a solder re-flow process to form solder balls or solder pastes in the terminal contact openings is performed. Therefore, a plurality of conductive bumps 308 is formed on the backside of the second electronic component package module 410. The conductive bumps 308 are adjacent to the passivation layer 306, covering a portion of the second conductive trace layer 304. The conductive bumps 308 are electrically connected to the second electronic component package module 410 and the first redistribution layer 252. In one embodiment, the conductive bumps 308 transmit input/output (I/O) signals, ground signals, and power signals of the first electronic component package module 400 and the second electronic component package module 410.

Figure 7B:
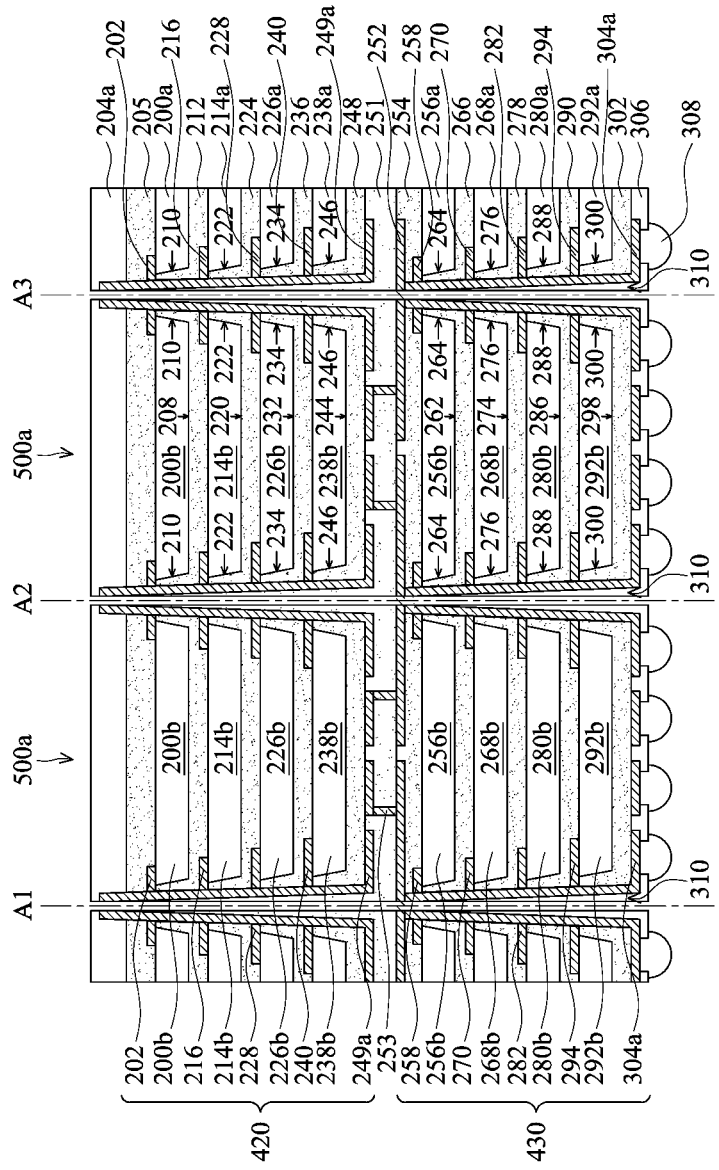

Next, referring to FIG. 7b, the packaging layer 204a, the first and second level electronic component package modules 400 and 410 are cut along scribe lines $A_1$, $A_2$ and $A_3$ to divide the first and second level electronic component package modules 400 and 410 into several individual electronic component packages 500a. As shown in FIG. 7b, after the cutting process, the first level electronic component package modules 400 is divided into several individual first electronic component package modules 420. And the second level electronic component package modules 410 is divided into several individual second electronic component package modules 430. Each first electronic component package module 420 has a first conductive trace layer 249a extended from two sides of the first electronic component package modules 420 to a portion of a bottom surface of the first electronic component package modules 420. Each second electronic component package module 430 has a second conductive trace layer 304a extended from two sides of the second electronic component package modules 430 to a portion of a bottom surface of the second electronic component package modules 430. One exemplary embodiment of the electronic component packages 500a comprises a packaging layer 204a. A first electronic component package 420 module with a top surface mounts on a surface of the packaging layer 204a. A second electronic component package module 430 with a top surface is laminated on a bottom of the first electronic component package module 420. The first electronic component package module 420 comprises semiconductor chips 200b, 214b, 226b and 238b laminated together, wherein backsides and sides of the semiconductor chips 200b, 214b, 226b and 238b are covered by insulating layers, respectively. A first conductive trace layer 249a is conformably mounted on sides of the semiconductor chips 200b, 214b, 226b and 238b and the backside of the first electronic component package modules 420, electrically connected to the semiconductor chips 200b, 214b, 226b and 238b. The second electronic component package module 430 comprises semiconductor chips 256b, 268b, 280b and 292b laminated together, wherein backsides and sides of the semiconductor chips 256b, 268b, 280b and 292b are covered by insulating layers, respectively. A second conductive trace layer 304a is conformably mounted on sides of the semiconductor chips 256b, 268b, 280b and 292b and the backside of the second electronic component package module 430, electrically connected to the semiconductor chips 256b, 268b, 280b and 292b. A first redistribution layer 252 is between the first and the second electronic component package modules 420 and 430, respectively electrically connected to the first conductive trace layer 249a of the first electronic component package module 420 and the second conductive trace layer 304a of the second electronic component package module 430. A conductive bump 308 is mounted on a bottom of the second electronic component package module 430, electrically connected to the second conductive trace layer 304a of the second electronic component package module 430.

In other embodiments, the electronic component package 500a may package several (two or more than two) electronic component package modules by laminating electronic component package modules at one time. And the electronic component package modules are electrically connected to each other through a redistribution layer to form a three-dimensional (3D) electronic component package, wherein each electronic component package modules is constructed by laminating several (two or more than two) semiconductor chips. Therefore, the electronic component package 500a may package four or more than four semiconductor chips at one time. The integrated density of the semiconductor chips may be improved. Additionally, the laminated number of the semiconductor chips of each electronic component package module is not limited. Also, the laminated number of the electronic component package modules of the electronic component package is not limited.

Embodiments of the invention have many advantageous features. Compared with the conventional electronic component package with a single electronic chip, one exemplary embodiment of the electronic component package 500a may package several (two or more than two) semiconductor chips by laminating the semiconductor chips at one time. A height of each packaged semiconductor chip may be reduced. Therefore, the electronic component package 500a may have a higher electronic component density. Thus, the goal of multi-chip packaging (MCP) may be achieved. Compared with the conventional chip scale packages (CSP) using wire binding technology, one exemplary embodiment of the electronic component package 500a may have several semiconductor chips comprising conductive layers through a packaging layer to form a laminated electronic component package without the conventional wire bonding technology. Therefore, fabrication cost may be reduced. One exemplary embodiment of the electronic component package 500a may be form by laminating several semiconductor chips, thereby forming a single electronic component package module. Next, several (two or more than two) electronic component package modules are laminated to form a single electronic component package, wherein the electronic component package modules are electrically connected to each other through a redistribution layer. The redistribution layer may redistribute positions of the conductive trace layers of the electronic component package modules. For example, the redistribution layer may be formed to extend the conductive trace layers from the periphery of the semiconductor chip to the entire surface of the semiconductor chip. Therefore, the electronic component package 500a may package four or more than four semiconductor chips at one time. The integrated density of the semiconductor chips may be improved.

FIGS. 8a and 8b are cross-sectional views showing the steps for forming an electronic component package in accordance with another embodiment of the present invention, showing an electronic component package having a second redistribution layer 316. Elements of the embodiments hereinafter, that are the same or similar as those previously described with reference to FIGS. 1 to 7a and 7b, are not repeated for brevity.

Next, referring to FIG. 8a, a eleventh insulating layer 314 covers a backside of the second electronic component package module 410, covering the second conductive trace layer 304. In one embodiment, the seventh insulating layer 266, the eighth insulating layer 278, the ninth insulating layer 290, the tenth insulating layer 302 and the eleventh insulating layer 314 may comprise the same materials and be formed by the same formation method. A second redistribution layer 316 is then formed on a bottom of the eleventh insulating layer 314, electrically connected to the second conductive trace layers 304 of the second electronic component package module 410 through metal interconnections. Additionally, the second conductive trace layers 304 are electrically connected to the first redistribution layer 249. Therefore, the second redistribution layer 316 is electrically connected to the first electronic component package module 400 and the second electronic component package module 410. In one embodiment, the second redistribution layer 316 may redistribute positions of the second conductive trace layers 304, for example, the second redistribution layer 316 may be formed to extend the second conductive trace layers 304 from the periphery of the semiconductor chip to the entire surface of the semiconductor chip, to transmit signals of each semiconductor chip of the first electronic component package module 400 and the second electronic component package module 410 to the exterior. The second redistribution layer 316 may be formed extended from the periphery of the semiconductor chip to the center of the semiconductor chip. Therefore, the subsequent conductive bumps are formed in positions extending from the periphery of the semiconductor chip to the center of the semiconductor chip.

Next, a thinning down process is performed to thin down a top surface 203 of the packaging layer 204 to form a packaging layer 204a with a preferred thickness by etching, milling or grinding and polishing the top surface 203 of the packaging layer 204.

Next, a passivation layer 318 is conformably formed on a backside of the second electronic component package module 410, covering the second redistribution layer 316. In one embodiment, the passivation layer 318 may be formed by coating solder mask materials. A patterning process is then performed to the passivation layer 318 to form terminal contact openings (not shown) on a surface of the second conductive trace layer 304. Then, solder joints may be formed filling the terminal contact openings of the passivation layer 318 by either plating through a patterned photo-resist or screen printing through a stencil mask. A final stripping of seed layers and (or) photo-resist followed by a solder re-flow process to form solder balls or solder pastes in the terminal contact openings is performed. Therefore, a plurality of conductive bumps 320 is formed on the backside of the second electronic component package module 410. The conductive bumps 320 are adjacent to the passivation layer 318, covering a portion of the second conductive trace layer 304. The conductive bumps 320 are electrically connected to the first redistribution layer 252 through the second redistribution layer 316. In one embodiment, the conductive bumps 320 transmit input/output (I/O) signals, ground signals, and power signals of the first electronic component package module 400 and the second electronic component package module 410.

Next, referring to FIG. 8b, the packaging layer 204a, and the first and second level electronic component package modules 400 and 410 are cut along scribe lines $A_1$, $A_2$ and $A_3$ to divide the packaging layer 204a, and the first and second level electronic component package modules 400 and 410 into several individual electronic component packages 500b. As shown in FIG. 8b, after the cutting process, the first level electronic component package modules 400 is divided into several individual first electronic component package modules 420. And the second level electronic component package modules 410 is divided into several individual second electronic component package modules 430. Each first electronic component package module 420 has a first conductive trace layer 249a extended from two sides of the first electronic component package modules 420 to a portion of a bottom surface of the first electronic component package modules 420. Each second electronic component package module 430 has a second conductive trace layer 304a extended from two sides of the second electronic component package modules 430 to a portion of a bottom surface of the second electronic component package modules 430. As shown in FIG. 8b, one exemplary embodiment of the electronic component packages 500b comprises a packaging layer 204a. A first electronic component package 420 module with a top surface mounts on a surface of the packaging layer 204a. A second electronic component package module 430 with a top surface is laminated on a bottom of the first electronic component package module 420. The first electronic component package module 420 comprises semiconductor chips 200b, 214b, 226b and 238b laminated together, wherein backsides and sides of the semiconductor chips 200b, 214b, 226b and 238b are covered by insulating layers, respectively. A first conductive trace layer 249a is conformably mounted on sides of the semiconductor chips 200b, 214b, 226b and 238b and the backside of the first electronic component package modules 420, electrically connected to the semiconductor chips 200b, 214b, 226b and 238b. The second electronic component package module 430 comprises semiconductor chips 256b, 268b, 280b and 292b laminated together, wherein backsides and sides of the semiconductor chips 256b, 268b, 280b and 292b are covered by insulating layers, respectively. A second conductive trace layer 304a is conformably mounted on sides of the semiconductor chips 256b, 268b, 280b and 292b and the backside of the second electronic component package module 430, electrically connected to the semiconductor chips 256b, 268b, 280b and 292b. A first redistribution layer 252 is between the first and the second electronic component package modules 420 and 430, respectively electrically connected to the first conductive trace layer 249a of the first electronic component package module 420 and the second conductive trace layer 304a of the second electronic component package module 430. A conductive bump 308 is mounted on a bottom of the second electronic component package module 430, electrically connected to the second conductive trace layer 304a of the second electronic component package module 430. A second redistribution layer 316 is between the second electronic component package modules 430 and the conductive bump 308, respectively electrically connected to the second conductive trace layer 304a of the second electronic component package module 430 and the conductive bump 308.

In other embodiments, the electronic component package 500b may package several (two or more than two) electronic component package modules by laminating electronic component package modules at one time. And the electronic component package modules are electrically connected to each other through a redistribution layer to form a three-dimensional (3D) electronic component package, wherein each electronic component package modules is constructed by laminating several (two or more than two) semiconductor chips. Therefore, the electronic component package 500b may package four or more than four semiconductor chips at one time. The integrated density of the semiconductor chips may be improved. Additionally, the laminated number of the semiconductor chips of each electronic component package module is not limited. Also, the laminated number of the electronic component package modules of the electronic component package is not limited.

The other exemplary embodiment of the electronic component package 500b of the invention has many advantageous features. Compared with the conventional electronic component package with a single electronic chip, one exemplary embodiment of the electronic component package 500b may package several (two or more than two) semiconductor chips by laminating the semiconductor chips at one time. A height of each packaged semiconductor chip may be reduced. Therefore, the electronic component package 500b may have a higher electronic component density. The goal of multi-chip packaging (MCP) may be achieved. Compared with the conventional chip scale packages (CSP) using wire binding technology, one exemplary embodiment of the electronic component package 500b may have several semiconductor chips comprising conductive layers through a packaging layer to form a laminated electronic component package without the conventional wire bonding technology. Therefore, fabrication cost may be reduced. One exemplary embodiment of the electronic component package 500b may be form by laminating several semiconductor chips, thereby forming a single electronic component package module. Next, several (two or more than two) electronic component package modules are laminated to form a single electronic component package, wherein the electronic component package modules are electrically connected to each other through a redistribution layer. The redistribution layer may redistribute positions of the conductive trace layers of the electronic component package modules. For example, the redistribution layer may be formed to extend the conductive trace layers from the periphery of the semiconductor chip to the entire surface of the semiconductor chip. Therefore, the electronic component package 500b may package four or more than four semiconductor chips at one time. The integrated density of the semiconductor chips may be improved. Another redistribution layer may be mounted between a bottom of the lowest electronic component package module and the conductive bumps to redistribute positions of the conductive bumps, for example, the positions of the conductive bumps may be from the periphery of the semiconductor chip to the entire surface of the semiconductor chip.

While the invention has been described by way of example and in terms of the embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electronic component package, comprising:
a packaging layer;
a first electronic component package module with a top surface mounted on a surface of the packaging layer;
a second electronic component package module laminated on a bottom of the first electronic component package module together, wherein the first and second electronic component package modules each respectively comprise:
at least two semiconductor chips laminated; and
an interior connection structure, comprising a conductive trace layer conformably mounted on sides and backsides of the corresponding electronic component package module, respectively electrically connecting the first and the second electronic component package modules, wherein at least one package module of the first and second electronic component package modules further comprises:
at least two conductive pads respectively disposed on and electrically connected to the two semiconductor chips of the package module and the at least two conductive pads extending to the sides of the package module to electrically connect to the conductive trace layer mounted on the sides of the package module;
an exterior connection structure, comprising a first redistribution layer between the first and the second electronic component package modules, respectively electrically connected to the conductive trace layer of the first and the second electronic component package modules; and a conductive bump mounted on a bottom of the second electronic component package module, electrically connected to the second electronic component package module, wherein the interior connection structure and the exterior connection structure are different.

2. The electronic component package as claimed in claim 1, wherein sides of the semiconductor chips of the first and the second electronic component package modules are not coplanar.

3. The electronic component package as claimed in claim 1, wherein angles between sides and the normal lines of the semiconductor chips of the first and the second electronic component package modules are the same.

4. The electronic component package as claimed in claim 3, wherein the angle has a value larger than 0° and smaller than 90°.

5. The electronic component package as claimed in claim 1, further comprising a second redistribution layer between the second electronic component package module and the conductive bump, respectively electrically connected to the conductive trace layer of the second electronic component package module and the conductive bump.

6. The electronic component package as claimed in claim 1, further comprising a protective layer covering a portion of the conductive trace layer conformably mounted on the sides and the backsides of the second electronic component package module, adjacent to the conductive bump.

7. The electronic component package as claimed in claim 1, wherein the sides and the backsides of the first and the second electronic component package modules are covered by an insulating layer, respectively.

8. A method for fabricating an electronic component package, comprising:

providing a packaging layer;

forming a first level electronic component package module on a surface of the packaging layer, wherein the first level electronic component package module is fabricated by laminating at least two semiconductor wafers together, and the semiconductor wafers respectively comprise at least two semiconductor chips separated from each other by a trench;

forming an exterior connection structure, said exterior connection structure comprising a first redistribution layer on a bottom surface of the first level electronic component package module, wherein the first redistribution layer is electrically connected to the first level electronic component package module;

forming a second level electronic component package module on a bottom surface of the first redistribution layer, wherein the second level electronic component package module is fabricated by laminating at least two semiconductor wafers together, and the semiconductor wafers respectively comprise at least two semiconductor chips isolated from each other by a trench;

forming a conductive bump on a bottom surface of the second level electronic component package module, electrically connected to the second level electronic component package module and the first redistribution layer, wherein each of the first and second level electronic component package modules respectively further comprise:

an interior connection structure, comprising a conductive trace layer conformably mounted on sides and backsides of the corresponding electronic component package module, respectively electrically connecting the first and the second level electronic component package modules, wherein at least one package module of the first and second level electronic component package modules further comprises:

at least two conductive pads respectively disposed on and electrically connected to the two semiconductor chips of the corresponding package module and the at least two conductive pads extending to the sides of the package module to electrically connect to the conductive trace layer, wherein the first redistribution layer is provided between the first and the second level electronic component package modules, respectively electrically connected to the conductive trace layer of the first and the second level electronic component package modules, and wherein the interior connection structure and the exterior connection structure are different.

9. The method for fabricating an electronic component package as claimed in claim 8, wherein forming the first level electronic component package module further comprises:

providing a first semiconductor wafer and a second semiconductor wafer respectively having at least two semiconductor chips, wherein each of the semiconductor chips comprise:

an electronic device; and a conductive pad mounted over the electronic device, electrically connected to the electronic device;

bonding the first semiconductor wafer to the packaging layer;

etching a backside of the first semiconductor wafer to form a first trench, exposing the conductive pad;

providing a first insulating layer on the backside of the first semiconductor wafer, filling the first trench;

bonding the first semiconductor wafer to the second semiconductor wafer, thereby laminating the first semiconductor wafer to the second semiconductor wafer; and etching a backside of the second semiconductor wafer to form a second trench, exposing a side of the conductive pad;

providing a second insulating layer on the backside of the second semiconductor wafer, filling the second trench;

removing a portion of the first insulating layer, the second insulating layer and packaging layer to form a first notch; and conformably forming a first conductive layer on the backside of the second semiconductor wafer and sides of the first notch, electrically connected to the sides of the conductive pads.

10. The method for fabricating an electronic component package as claimed in claim 9, wherein forming the second level electronic component package module further comprises:

providing a third semiconductor wafer and a fourth semiconductor wafer respectively having at least two semiconductor chips, wherein each of the semiconductor chips comprises:

an electronic device; and a conductive pad mounted over the electronic device, electrically connected to the electronic device;

bonding the third semiconductor wafer to the first level electronic component package module;

etching a backside of the third semiconductor wafer to form a third trench, exposing a side the conductive pad;

providing a third insulating layer on the backside of the third semiconductor wafer, filling the third trench;

bonding the third semiconductor wafer to the fourth semiconductor wafer, thereby laminating the third semiconductor wafer and the fourth semiconductor wafer; and etching a backside of the fourth semiconductor wafer to form a fourth trench, until the conductive pad is exposed;

providing a fourth insulating layer on the backside of the fourth semiconductor wafer, filling the fourth trench;

removing a portion of the third insulating layer, the fourth insulating layer and second insulating layer to form a second notch; and conformably forming a second conductive layer on the backside of the fourth semiconductor wafer and sides of the second notch, electrically connected to the sides of the conductive pads, the first redistribution layer and the conductive bump.

11. The method for fabricating an electronic component package as claimed in claim 10, further comprising:

forming a second redistribution layer between the conductive bump and the second level electronic component package module, electrically connected to the second conductive layer and the conductive bump.

12. The method for fabricating an electronic component package as claimed in claim 10, wherein the first, second, third and fourth trenches are aligned with each other.

13. The method for fabricating an electronic component package as claimed in claim 8, wherein the sides of the semiconductor chips of the first level electronic component package module and the sides of the semiconductor chips of the second level electronic component package module are not coplanar.

14. The method for fabricating an electronic component package as claimed in claim 8, wherein angles between the sides and the normal lines of the semiconductor chips of the first or second level electronic component package modules are the same.

15. The method for fabricating an electronic component package as claimed in claim 14, wherein the angles are larger than 0° and smaller than 90°.

16. The method for fabricating an electronic component package as claimed in claim 8, further comprising:

forming a protection layer covering a portion of the second conductive layer of the second level electronic component package module, adjacent to the conductive bump.

17. The method for fabricating an electronic component package as claimed in claim 8, further comprising:

thinning the packaging layer before forming the conductive bump.

18. The method for fabricating an electronic component package as claimed in claim 9, further comprising thinning the backside of the first semiconductor wafer before forming the first trench.

19. The method for fabricating an electronic component package as claimed in claim 9, further comprising thinning the backside of the second semiconductor wafer before forming the second trench.

20. The method for fabricating an electronic component package as claimed in claim 10, further comprising thinning the backside of the third semiconductor wafer before forming the third trench.

21. The method for fabricating an electronic component package as claimed in claim 10, further comprising thinning the backside of the fourth semiconductor wafer before forming the fourth trench.

22. The method for fabricating an electronic component package as claimed in claim 10, further comprising:

cutting the first and second level electronic component package modules along trenches of the first and second level electronic component package modules to divide each packaged semiconductor chip.

* * * * *